United States Patent [19]

Oishi et al.

[11] Patent Number: 4,990,999
[45] Date of Patent: Feb. 5, 1991

[54] SEMICONDUCTOR MEMORY DEVICE USING HIGH-DENSITY AND HIGH-SPEED MOS ELEMENTS

[75] Inventors: Motohiro Oishi; Kunio Matsudaira, both of Ikeda; Keiji Fukumura, Toyonaka; Shigemi Sasada, Takarazuka, all of Japan

[73] Assignee: Ricoh Company, Ltd., Tokyo, Japan

[21] Appl. No.: 416,494

[22] Filed: Oct. 3, 1989

[30] Foreign Application Priority Data

Oct. 20, 1988 [JP] Japan .................. 63-266576

[51] Int. Cl.⁵ .................. H01L 29/44; H01L 27/10
[52] U.S. Cl. .................. 357/71; 357/65; 357/45
[58] Field of Search .................. 357/65, 71, 45

[56] References Cited

U.S. PATENT DOCUMENTS 4,352,031  9/1982  Holbrook et al. .................. 357/45
4,707,717  11/1987  Hirabayashi et al. .................. 357/23.11

FOREIGN PATENT DOCUMENTS 0072763  2/1983  European Pat. Off. .
0109854  5/1984  European Pat. Off. .
59-217356  12/1984  Japan .................. 357/45
61-287164  12/1986  Japan .................. 357/45
62-145862  6/1987  Japan .................. 357/45

Primary Examiner—Jerome Jackson, Jr.
Attorney, Agent, or Firm—Cooper & Dunham

[57] ABSTRACT

A semiconductor memory device in which MOS transistors are used. The device has diffusion lines and polysilicon lines formed on a semiconductor substrate, first and second insulating films covering the diffusion lines and the polysilicon lines, respectively. The diffusion lines extend at intervals and parallel with each other, and constitute bit lines of the memory device. The polysilicon lines extend at intervals, intersect the diffusion lines, and constitute word lines of the memory device. Metal wiring lines are formed on the second insulating film are each positioned over every other diffusion line in such a manner as to extend along the corresponding diffusion line, each metal wiring line being electrically connected to the corresponding diffusion line through a contact hole. Two regions of two adjacent diffusion lines that are underneath the two intersections of these two adjacent diffusion lines and one polysilicon line constitute the source region and the drain region of one MOS transistor, and a portion of the polysilicon line which is between the source region and the drain region constitutes the gate of the MOS transistor. Thus, MOS transistors of the device can be disposed with an increased density, without involving any reduction in the operation speed of the device.

7 Claims, 4 Drawing Sheets

SEMICONDUCTOR MEMORY DEVICE USING HIGH-DENSITY AND HIGH-SPEED MOS ELEMENTS

BACKGROUND OF THE INVENTION

1. Field of the Invention

The present invention relates to a semiconductor memory device in which MOS elements are used.

2. Discription of the Related Art

Japanese Patent Laid-Open No. 287164/1986 discloses a method of manufacturing a high-density memory device by forming band-shaped diffused layers at regular intervals on a semiconductor substrate, covering these diffused layers with an oxide film, and forming band-shaped polysilicon layers on the oxide film at regular intervals in such a manner that these polysilicon layers intersect the diffused layers and thus form a grating-like structure. Each intersection in the grating-like structure forms a source region or a drain region of one MOS transistor, while a portion of each polysilicon layer between the source region and the drain region forms a gate of the MOS transistor.

Normally, a polysilicon layer constitutes a word line of the memory device, while a diffused layer constitutes a bit line of the memory device. In a memory device having such construction, since the diffused layers extend over a relatively long distance, the parasitic impedance of each of the diffused layers has a non-negligible value, and may cause a reduction in the operation speed of the memory device. In order to eliminate this disadvantageous effect of the parasitic impedance, it is known to provide a band-shaped metal layer immediately above each of the diffused layers.

In this case, it is necessary to form contact holes for effecting contact between the metal layers and the diffused layers. However, since fine-forming techniques used to form the metal layers involve various limitations, it is difficult to reduce the area required for forming each contact hole. As a result, in a case where the above-described metal layers are provided, it is necessary to increase the intervals at which the diffused layers are formed. This in turn makes it difficult to increase the density of the elements of the memory device.

SUMMARY OF THE INVENTION

It is therefore an object of the present invention to provide a semiconductor memory device in which MOS elements are used, and which is capable of increasing the density of the MOS elements and the operating speed of the device concurrently.

The above-stated object of the present invention is achieved by a semiconductor memory device comprising: diffusion lines formed on a semiconductor substrate in such a manner as to extend at intervals and parallel with each other, the diffusion lines constituting bit lines of the memory device; a first insulating film formed on said semiconductor substrate in order to cover the diffusion lines; polysilicon lines formed on the first insulating film in such a manner as to extend at intervals and intersect the diffusion lines, the polysilicon lines constituting word lines of the memory device; a second insulating film formed on said first insulating film in order to cover the polysilicon lines; and metal wiring lines formed on the second insulating film in such a manner as to be positioned over every other diffusion line and extend along a corresponding diffusion line respectively, each of the metal wiring lines being electrically connected to the corresponding diffusion line through at least one contact hole penetrating said first and second insulating films, wherein two regions within two adjacent diffusion lines which are respectively underneath two intersections of the two adjacent diffusion lines and one polysilicon line constitute a source region and a drain region respectively of one MOS transistor, and a portion of said one polysilicon line which is between the source region and the drain region constitutes a gate of the one MOS transistor.

With the semiconductor memory device according to the present invention, since the metal wiring lines are provided at every other diffusion line, it is possible to provide two MOS transistors between a pair of metal wiring lines per word line which intersects these metal wiring lines without increasing the interval between the metal wiring lines. Thus, the integration density of the MOS elements can be enhanced without being restricted by the limitations concerning the fine-forming techniques used to form the metal wiring lines.

Furthermore, because the metal wirings, such as Al wirings, are used, it is possible to prevent any reduction in the speed at which the device operates as a memory.

Further objects and advantages of the present invention will be apparent from the following description of the preferred embodiments of the invention as illustrated in the accompanying drawings.

DESCRIPTION OF THE PREFERRED EMBODIMENTS

Figure 1:
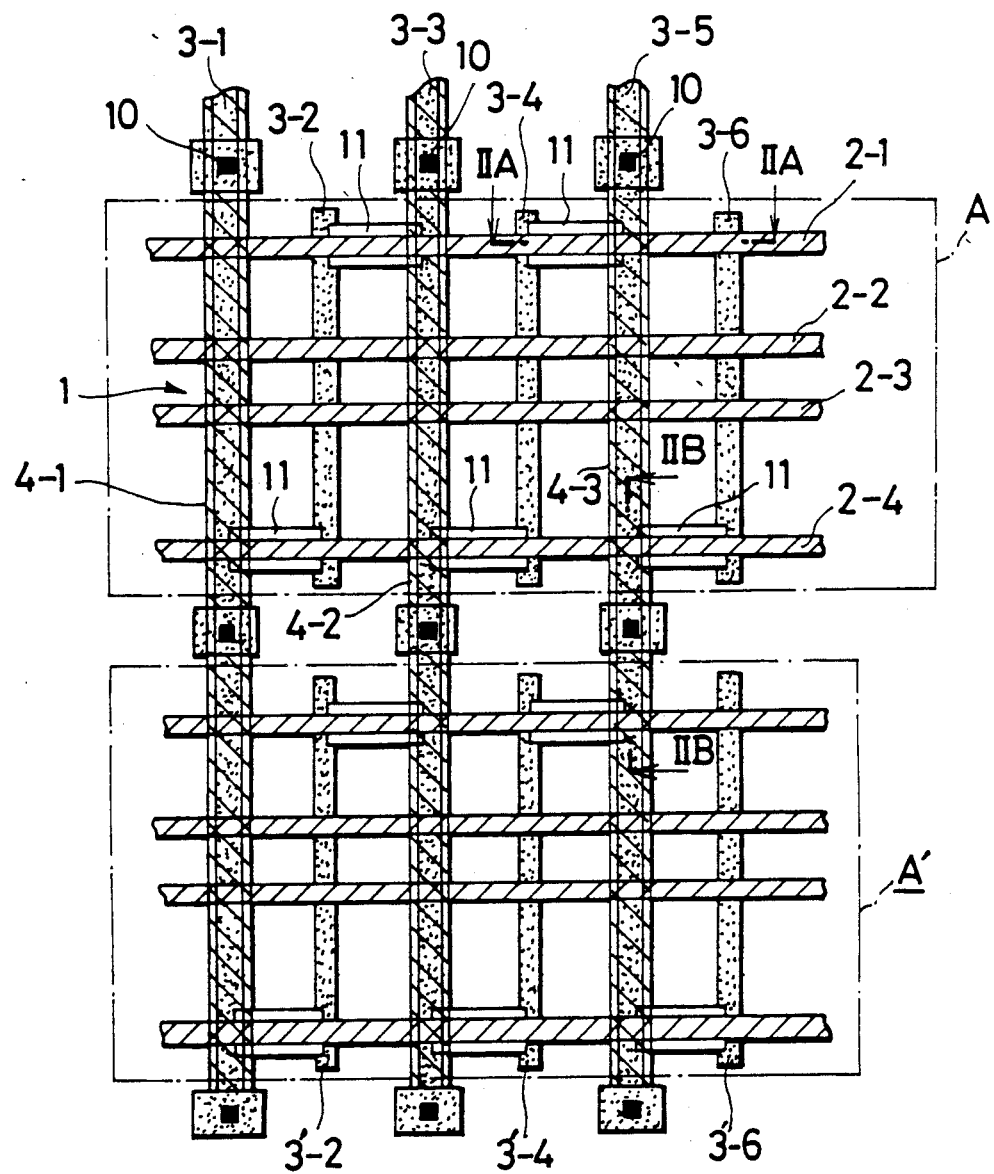
FIG. 1 is a view showing a pattern of a semiconductor memory device in accordance with one embodiment of the present invention.

FIG. 1 shows one embodiment of the semiconductor memory device of the present invention. Designated by symbol A in the figure is a memory cell of the device.

The memory cell A is formed by forming, on a p+ substrate 1 at certain intervals, a plurality of polysilicon lines 2-1, 2-2, 2-3 and 2-4 (hereafter these will be generally denoted by reference numeral 2), which are each constituted of a band-shaped polysilicon layer, and a plurality of diffusion lines 3-1, 3-2, 3-3, 3-4, 3-5 and 3-6 (hereafter these will be generally denoted by reference numeral 3), which are each constituted of a band-shaped n+ diffusion layer. The polysilicon lines 2 are formed in such a manner as to extend in the horizontal direction as viewed in the figure, while the diffusion lines 3 are formed in such a manner as to extend in the vertical direction. Thus, the polysilicon lines 2 and the diffusion lines 3 intersect each other and form a grating-like structure.

As is clearly shown in FIG. 1, in the illustrated embodiment, wiring lines 4, each constituted of a metal layer such as an A1 layer, are provided over every other diffusion line 3. Specifically, in the illustrated example, metal wiring lines 4-1, 4-2 and 4-3 are provided immediately over the diffusion lines 3-1, 3-3 and 3-5, respectively.

Each of the metal wiring lines 4 is in contact with the corresponding diffusion line 3 through a contact point 10.

In the figure, reference numeral 11 denotes regions in which p type impurities, for example, of boron are implanted. A MOS transistor in each of these regions 11 has a high threshold value and, accordingly, the MOS transistor is always in open or off state.

Figure 2A:
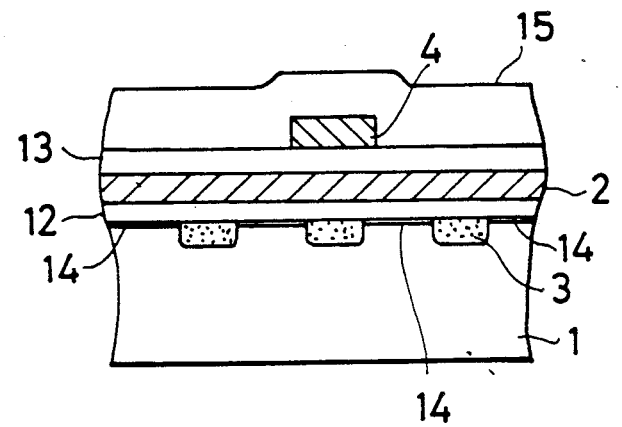
FIG. 2a is a sectional view of the semiconductor memory device shown in FIG. 1, taken along the line IIa—IIa.
Figure 2B:
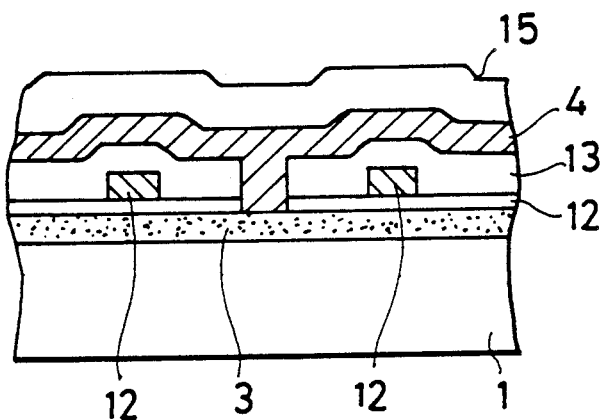
FIG. 2b is a sectional view of the semiconductor memory device shown in FIG. 1, taken along the line IIb—IIb.

FIG. 2a shows a section of the memory device, which is taken along the line IIa—IIa shown in FIG. 1. FIG. 2b shows a section of the memory device, which is taken along the line IIb—IIb shown in FIG. 1.

In the figure, there is shown an $SiO_2$ film 12 serving as the first insulating film; a PSG (phospho-silicate glass) film 13 serving as the second insulating film; and a passivation film 15. The memory cell A also includes channel regions 14.

The intersection of one polysilicon line 2 and one diffusion line 3 forms a drain or source, while a portion of one polysilicon line 2 which is between a drain and a source next to the drain forms a gate. A channel of the MOS transistor is formed underneath the gate.

Figure 3:
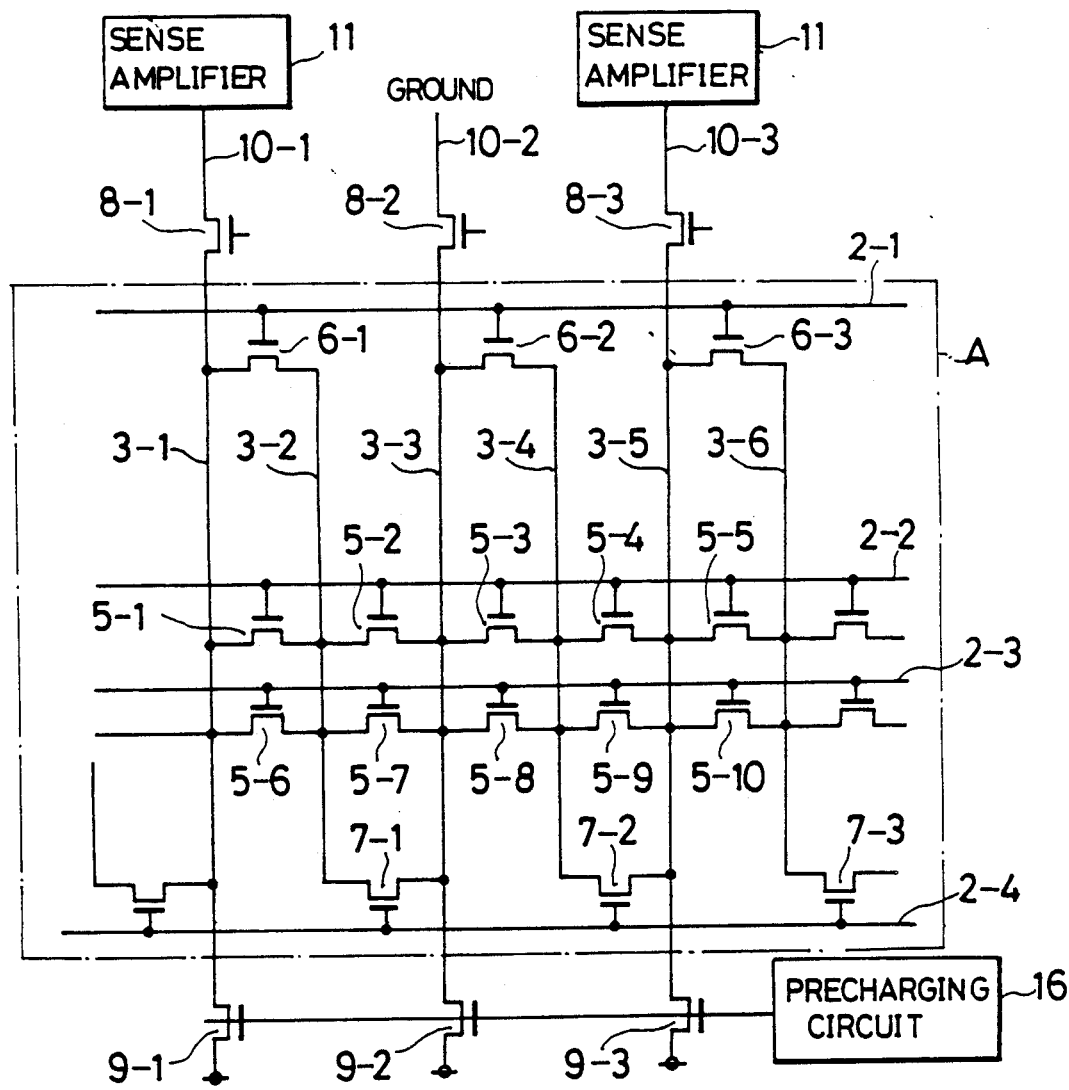
FIG. 3 is a view showing an equivalent circuit of a memory cell of the semiconductor memory device shown in FIG. 1.

A part of FIG. 3 which is enclosed by the dashed line shows an equivalent circuit of the memory cell A of the memory device shown in FIG. 1, that is, of a memory formed by the diffusion lines 3-1 to 3-6 and the polysilicon lines 2-1 to 2-4.

The equivalent circuit has MOS transistors 5-1 to 5-10 (hereafter these will be generally denoted by reference numeral 5), 6-1 to 6-3 and 7-1 to 7-3. The polysilicon lines 2-2 and 2-3 form word lines, while the diffusion lines 3-1 to 3-6 form bit lines.

In this way, according to this embodiment, the word lines, which also serve as gate electrodes, extend in the longitudinal direction of the channels extending from the source regions to the drain regions.

The gates of the MOS transistors 6-1, 6-2 and 6-3 are connected to the line 2-1, while the gates of the MOS transistors 7-1, 7-2 and 7-3 are connected to the line 2-4.

With the above-described construction, by virtue of the arrangement where the metal wiring lines 4 are in contact with the diffusion lines 3, the parasitic impedance of the diffusion lines 3 is reduced. When, for instance, the MOS transistor 5-1 is to be selected from among the MOS transistors 5 in the circuit, the following operations are performed. The word line 2-2 is brought to the H (high) level, thereby turning on the transistor 5-1. Subsequently, the line 2-1 is brought to the L (low) level, thereby turning off the MOS transistor 6-1, and the line 2-4 is brought to the H level, thereby turning on the MOS transistor 7-1. Further, a MOS transistor 8-1 which is provided between the equivalent circuit and a sense amplifier 11 is turned on, and an output line 10-1 extending from the transistor 8-1 is connected to the sense amplifier 11.

Subsequently, a MOS transistor 8-2 is turned on, and a line 10-2 extending therefrom is connected to the ground level. By the above-described operations, the source of the MOS transistor 5-1 is brought to the ground level, while the drain of the MOS transistor 5-1 is brought to the level of a certain voltage since the MOS transistor 8-1 is turned on. The MOS transistor 5-1 is selected in this way.

While the thus achieved condition is maintained, if the word line 2-2 is brought to the L level and, instead, the word line 2-3 is brought to the H level, the MOS transistor 5-6 will be selected.

Similarly, in a case where the word line 2-2 is brought to the H level, and the word line 2-3 is brought to the L level, while the word line 2-1 is brought to the H level, and the word line 2-4 is brought to the L level, the MOS transistor 5-2 can be selected.

As described above, since the metal wiring lines 4 are provided at every other diffusion line 3, it is possible to provide two MOS transistors 5 between a pair of metal wiring lines 4 per word line 2 intersecting these metal wiring lines 4, without increasing the interval between adjacent diffusion lines. Thus, the integration density of the MOS elements can be enhanced without being restricted by the limitations concerning the fine-forming techniques used to form the metal wiring lines 4.

Furthermore, since metal wirings, such as A1 wirings, are used, it is possible to prevent any reduction in the speed at which the device operates as a memory.

As shown in FIG. 1, it is possible to connect the memory cell A with another memory cell A' having a similar construction. In this case, the diffusion lines which are not provided with metal wiring lines 4 are cut into segments each having a suitable length in order that they are separated into diffused layers 3-2, 3-4 and 3-6, and diffused layers 3'-2, 3'-4 and 3'-6, as shown in the figure. Therefore, it is possible to reduce the parasitic impedance for all of these diffusion lines and, hence, to increase the operation speed.

Furthermore, in the above-described construction, since the MOS transistors 5-1 and 7-1 are the only transistors that are present in the path of current flowing through the memory cell A, the current flowing through the memory cell can be made small, thereby making it possible to attain an increase in the operation speed.

Still further, each of the diffused layers 3-2, 3-4, and 3-6 is used as both a source and a drain of two adjacent serially-connected MOS transistors 5. Therefore, in contrast with a conventional NOR-type memory cell in which bit lines and GND lines are individually provided, the construction of the device of the present invention makes it possible to use a single line as both a bit line and a GND line, thereby enabling a reduction in the number of the column lines used and, hence, enabling a reduction in the area of the entire memory cell. This feature is advantageous to a case where the device is a large-capacity memory.

Figure 4:
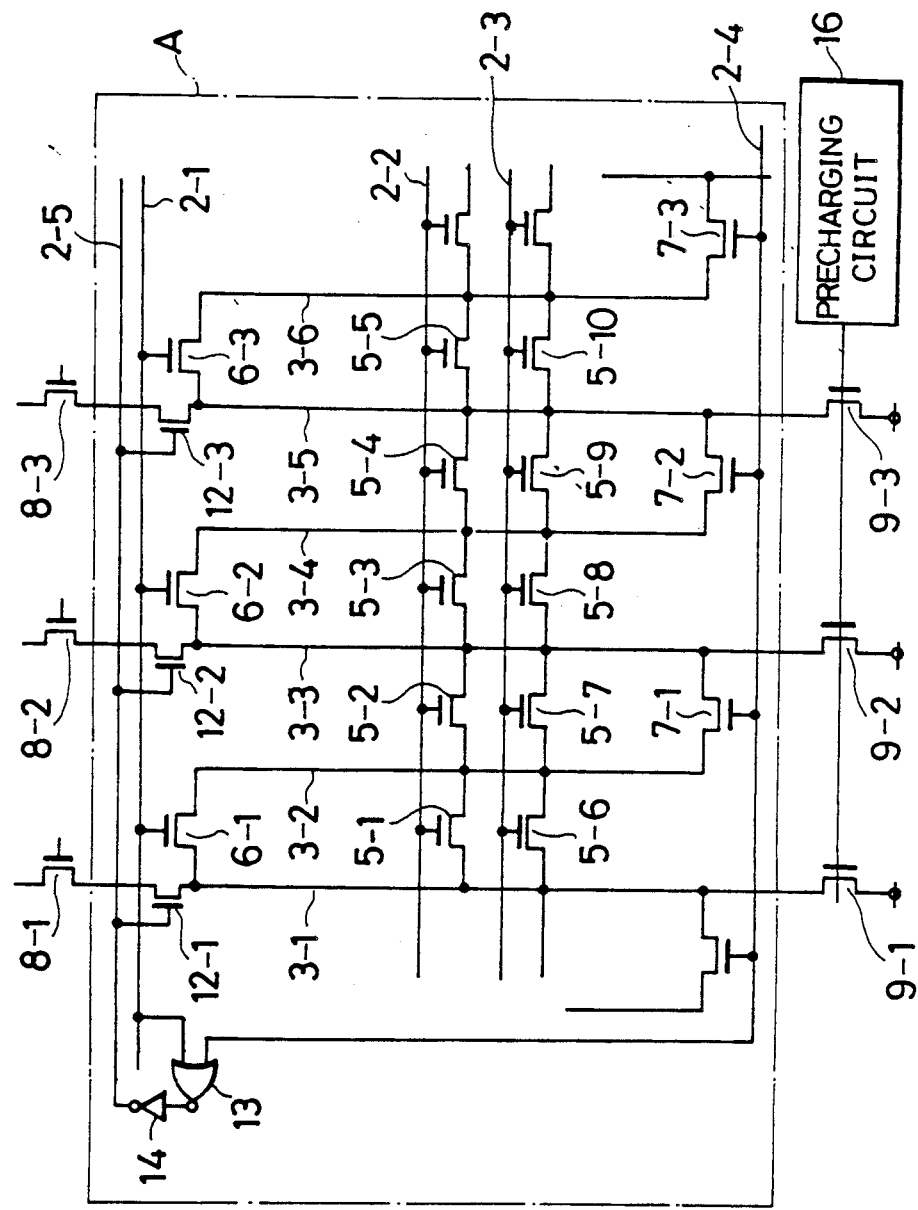
FIG. 4 is a view showing an equivalent circuit of a memory cell of a semiconductor memory device in accordance with another embodiment of the present invention.

Another embodiment of the present invention is shown in FIG. 4. In this embodiment, MOS transistors 12-1, 12-2 and 12-3 are connected in series with MOS transistors 8-1, 8-2 and 8-3 respectively, an NOR gate 13 is connected with the lines 2-1 and 2-4; and the output of the NOR gate 13 is connected via an inverter 14 to the respective gates of the MOS transistors 12-1, 12-2 and 12-3. The NOR gate 13 and the inverter 14 may be substituted by an OR gate.

With the above-described construction, when one of the lines 2-1 and 2-4 is brought to the H level, a line 2-5 is brought to the H level, whereby the MOS transistors 12-1, 12-2 and 12-3 are turned on, while the bit lines 3-1 and 3-5 are connected to the sense amplifiers 11 (not shown in FIG. 4) via the MOS transistors 12-1 and 12-3, respectively, and the bit line 3-3 is grounded via the MOS transistor 12-2. In this way, the memory is brought into its operating condition.

When both lines 2-1 and 2-4 are at the L level, i.e., when the associated columns are not to be used, the condition. The bit lines 3-2, 3-4 and 3-6 which are not provided with metal wiring lines are each divided into segments at every cell. By virtue of this construction, when the MOS transistors 12-1, 12-2 and 12-3 are turned off, the capacitance of diffusion lines 3 of the memory device is not that corresponding to the entirety of the memory device but is limited to that solely corresponding to a single cell. Therefore, it is possible to reduce the electrostatic capacitance of the diffusion lines during the operation of the memory, and this in turn makes it possible to lower the level of bit-line delay which is one problem in a semiconductor memory device.

In FIGS. 3 and 4, reference numeral 16 denotes a precharging circuit. Hitherto, in the field of the semiconductor memory device of this type, it has been done, during non-operating condition of the memory elements, to maintain the bit lines at a certain potential, i.e., to precharge the same, so that the device can operate at a high speed during operating condition.

In the circuit shown in FIG. 3, MOS transistors 9-1, 9-2 and 9-3 are provided for supplying a precharging potential to the bit lines 3-1 to 3-6. These MOS transistors 9-1, 9-2 and 9-3 are connected between a precharging power source (not shown) and the bit lines 3-1, 3-3 and 3-5. Their respective gates are connected to the precharging circuit 16.

While each of the transistors 8-1, 8-2 and 8-3 is in the off-condition, that is, while no column line is selected, the corresponding bit lines 3-1, 3-3 and 3-5 are connected to the precharging potential, so that each of the bit lines 3-1 to 3-6 can be maintained at the precharging potential by turning on the MOS transistors 9-1, 9-2 and 9-3 with a signal from the precharging circuit 16.

Since only one MOS transistor for supplying the precharging potential is necessary per two bit lines, it is possible to reduce the number of MOS transistors required for supplying the precharging potential as compared with a conventional device.

Since these MOS transistors 9-1, 9-2 and 9-3 are connected to the bit lines by the metal wiring lines 4, it is possible to increase the speed at which the memory device operates.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor memory device comprising:
a plurality of diffusion lines formed on a semiconductor substrate so as to extend at intervals and parallel with each other, each of said diffusion lines constituting a bit line of the memory device;
a first insulating film formed on said semiconductor substrate in order to cover each of said diffusion lines;
a plurality of polysilicon lines formed on said first insulating film so as to extend at intervals and intersect each of said diffusion lines, each of said polysilicon lines constituting a word line of the memory device;
a second insulating film formed on said first insulating film in order to cover each of said polysilicon lines; and
a plurality of metal wiring lines formed on said second insulating film so as to be positioned over every second one of said diffusion lines and to extend respectively along the corresponding diffusion line positioned underneath the metal wiring line, each of said metal wiring lines being electrically connected to said corresponding diffusion line through at least one contact hole penetrating said first insulating film and said second insulating film;
one region which is underneath one intersection of one diffusion line and one polysilicon line constituting a source region of one MOS transistor, another region which is underneath another intersection of another diffusion line adjacent to said one diffusion line and said one polysilicon line constituting a drain region of said one MOS transistor, a portion of said one polysilicon line which is between said source region and said drain region constituting a gate of said one MOS transistor.

2. A device according to claim 1, wherein said semiconductor substrate is constituted of $p^+$ type semiconductor and each of said diffusion lines is constituted of an $n^+$ type diffused layer formed by diffusion of impurities into a surface of said seminconductor substrate.

3. A device according to claim 1, wherein each of said metal wiring lines is constituted of aluminum.

4. A device according to claim 1, wherein said first insulating film is constituted of $SiO_2$, and said second insulating film is constituted of phosphosilicate glass.

5. A device according to claim 1, wherein a passivation film is formed on said second insulating film.

6. A device according to claim 1, wherein said semiconductor memory device is divided into a plurality of memory cells, each of said memory cells has a precharging circuit for applying a predetermined voltage to each of said diffusion lines when the memory cell is not accessed from the outside.

7. A device according to claim 6, wherein said diffusion lines connected to the metal wiring lines of each of said memory cells are connected to respective reading lines of the memory device via respective MOS transistors which are turned on when the memory cell is accessed from the outside.

* * * * *